(12) United States Patent
Sohn

(10) Patent No.: US 7,339,438 B2
(45) Date of Patent: Mar. 4, 2008

(54) PHASE AND DELAY LOCKED LOOPS AND SEMICONDUCTOR MEMORY DEVICE HAVING THE SAME

(75) Inventor: Young-Soo Sohn, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 177 days.

(21) Appl. No.: 11/259,545

(22) Filed: Oct. 25, 2005

(65) Prior Publication Data

US 2006/0097795 A1 May 11, 2006

(30) Foreign Application Priority Data

Nov. 8, 2004 (KR) ...................... 10-2004-0090596

(51) Int. Cl.
*H03L 7/089* (2006.01)

(52) U.S. Cl. .............................. 331/17; 331/8; 331/25; 327/157; 327/158

(58) Field of Classification Search .................... 331/8, 331/10, 11, 17, 18, 2, 25; 327/156–159; 332/127; 360/51; 375/376; 455/260
See application file for complete search history.

(56) References Cited

U.S. PATENT DOCUMENTS 5,831,483 A * 11/1998 Fukuda ........................ 331/17
6,043,715 A   3/2000 Bailey et al.
6,779,126 B1 * 8/2004 Lin et al. ..................... 713/500

FOREIGN PATENT DOCUMENTS

| KR | 2001-0050937 | 6/2001 |
|---|---|---|
| KR | 2001-92529 | 10/2001 |
| KR | 2003-0028312 | 4/2003 |

OTHER PUBLICATIONS

English language abstract of Korean Publication 2001-0050937.
English language abstract of Korean Publication 2001-92529.
English language abstract of Korean Publication No. 2003-0028312.

* cited by examiner

*Primary Examiner*—David Mis
(74) *Attorney, Agent, or Firm*—Marger Johnson & McCollom, P.C.

(57) ABSTRACT

A phase locked loop includes a phase difference detector for detecting a phase difference between an input clock signal and an output clock signal to generate an up signal and a down signal; a charge pump for raising a level of a control signal by supplying a supply current in response to the up signal, for lowering a level of the control signal by discharging a discharge current in response to the down signal, and for adjusting the supply current in response to a first control voltage and by discharge current in response to a second control voltage in a locked state; a compensator for generating the first and second control voltages corresponding to difference between the up signal and the down signal in the locked state; and a voltage controlled oscillator for varying a frequency of the output clock signal in response to the control signal.

34 Claims, 9 Drawing Sheets

PHASE AND DELAY LOCKED LOOPS AND SEMICONDUCTOR MEMORY DEVICE HAVING THE SAME

CROSS-REFERENCE TO RELATED APPLICATION

This application claims the benefit of Korean Patent Application No. 2004-90596, filed Nov. 8, 2004, the disclosure of which is hereby incorporated herein by reference in its entirety.

BACKGROUND OF THE INVENTION

1. Field of the Invention

This disclosure relates to phase and delay locked loops, more particularly, to phase and delay locked loops having a charge pump, and semiconductor memory devices having phase delay locked loops.

2. Description of the Related Art

In conventional phase and delay locked loops using a charge pump, a single output charge pump supplies current from a supply constant current source to an output terminal in response to an up signal, and discharges current through a discharge constant current source from the output terminal in response to a down signal. However, even though the single output charge pump is designed such that the supply constant current source and the discharge constant current source have the same current amount, the supply constant current source and the discharge current source may differ from each other in actual operation.

In general, phase and delay locked loops attempt to make an input clock signal and an output clock signal identical in phase. When the phases of the two clock signals are approximately the same, the loop enters a locked state. Thereafter, an up signal and a down signal, adjusting the phase of the output clock signal, should be identical. However, since the supply current amount and the discharge current amount are often different in practice, the loop does not enter a locked state when the up signal and the down signal are identical, but enters a locked state when the up signal and the down signal have a pulse width or a phase difference.

The above-described phase and pulse width difference may occur in delay locked loops as well as phase locked loops.

SUMMARY OF THE INVENTION

Embodiments provide phase and delay locked loops which compensate for current amount differences between the supply constant current source and the discharge constant current source of a charge pump in a locked state to remove a phase difference between a input clock signal and an output clock signal.

Further embodiments provide semiconductor memory devices having such phase locked loops or delay locked loops.

BRIEF DESCRIPTION OF THE DRAWINGS

The features and advantages of the invention will become more apparent to those of ordinary skill in the art through the detailed description of embodiments with reference to the attached drawings in which.

DETAILED DESCRIPTION OF THE INVENTION

Embodiments will now be described more fully with reference to the accompanying drawings. This invention may, however, be embodied in different forms and should not be construed as limited to the embodiments set forth herein. Rather, these embodiments are provided so that this disclosure will be thorough and complete, and will fully convey the scope of the invention to those skilled in the art. Throughout the specification, like numbers refer to like elements.

Figure 1:
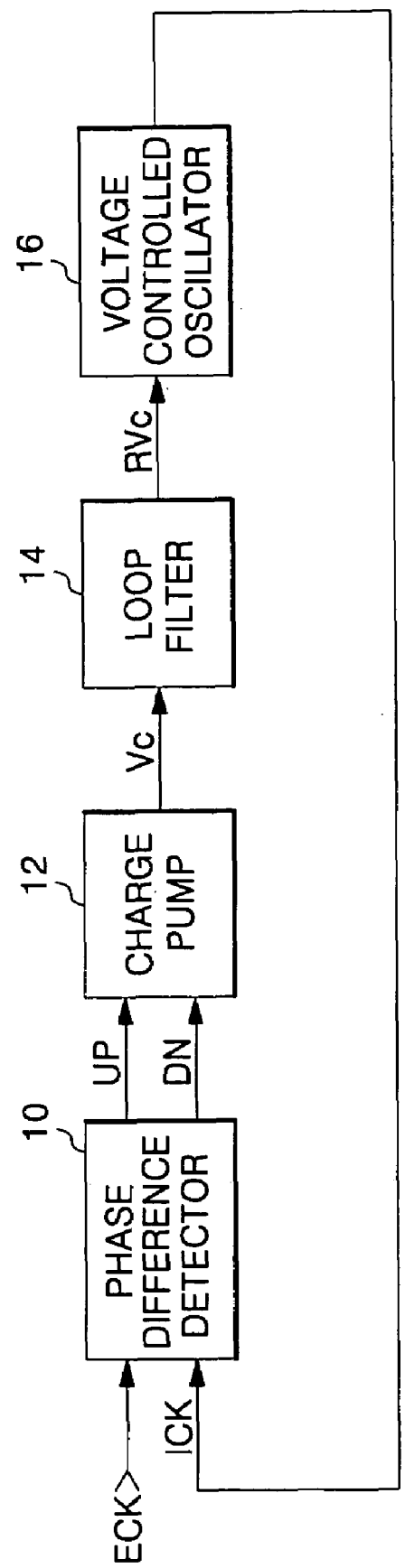
FIG. 1 is a block diagram illustrating a conventional phase locked loop.

FIG. 1 is a block diagram illustrating a conventional phase locked loop. The phase locked loop of FIG. 1 includes a phase difference detector 10, a charge pump 12, a loop filter 14, and a voltage controlled oscillator 16. The functions of the components of FIG. 1 are explained below.

The phase difference detector 10 detects a phase difference between an input clock signal ECK and an output clock signal ICK, generating an up signal UP when the phase of the input clock signal ECK leads the phase of the output clock signal ICK, and generating a down signal DN when the phase of the input clock signal ECK lags the phase of the output clock signal ICK. The charge pump 12 performs a pumping operation in response to the up signal UP to increase a voltage level of a control signal Vc and performs a pumping operation in response to the down signal DN to decrease the voltage level of the control signal Vc. The loop filter 14 filters the control signal Vc to output a filtered control signal RVc. The voltage controlled oscillator 16 adjusts a frequency of the output clock signal ICK in response to the filtered control signal RVc.

Figure 2:
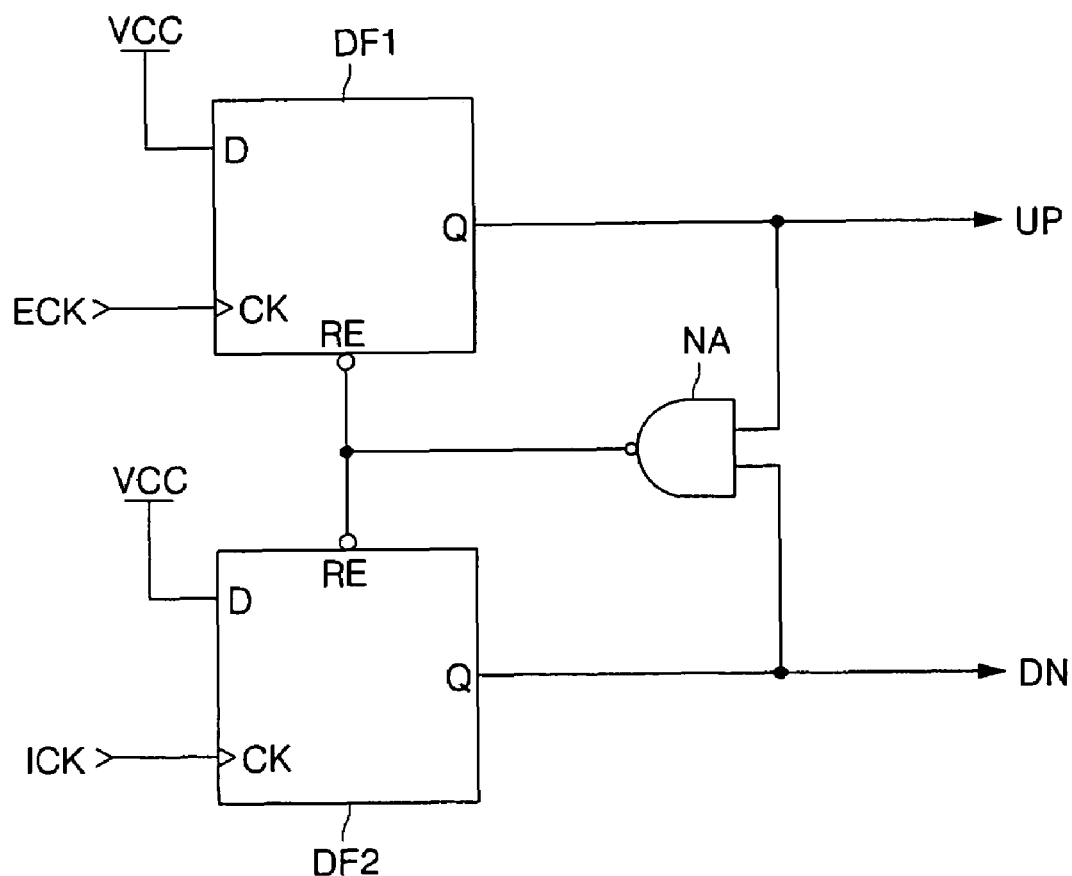
FIG. 2 is a circuit diagram illustrating a phase difference detector of the conventional phase locked loop of FIG. 1.

FIG. 2 is a circuit diagram illustrating the phase difference detector of the conventional phase locked loop of FIG. 1. The phase difference detector of FIG. 2 includes D-flip flops DF1 and DF2 and an NAND gate NA. The functions of the components of FIG. 2 are explained below.

The D-flip flop DF1 generates a high level on the up signal UP on a rising edge of the input clock signal ECK and is reset to a low level when an output signal of the NAND gate NA is a low level. The D-flip flop DF2 generates a high level on the down signal DN on a rising edge of the output clock signal ICK and is reset to a low level when the output signal of the NAND gate NA is a low level. The NAND gate NA generates a low level when the up signal UP and the down signal DN are both a high level.

Figure 3A:
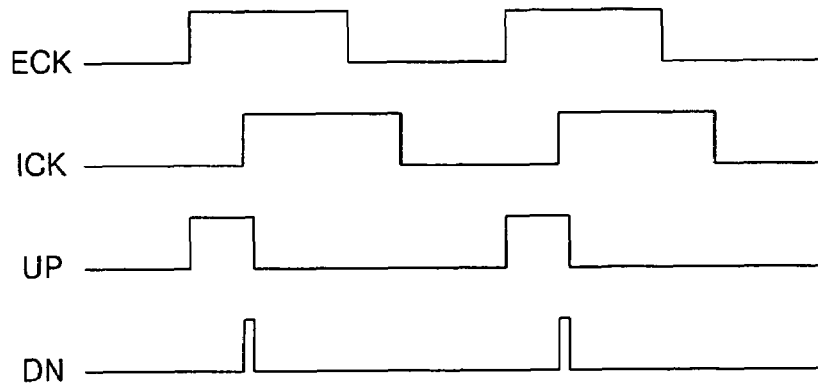
FIGS. 3a to 3c are timing diagrams illustrating operation of the phase difference detector of FIG. 2.
Figure 3B:
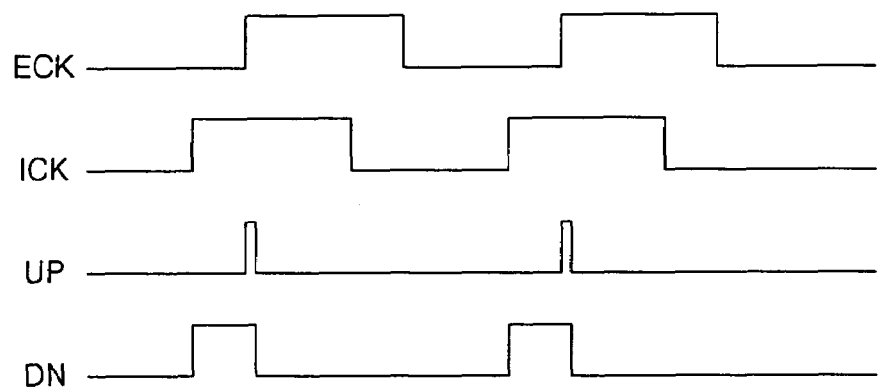
Figure 3C:
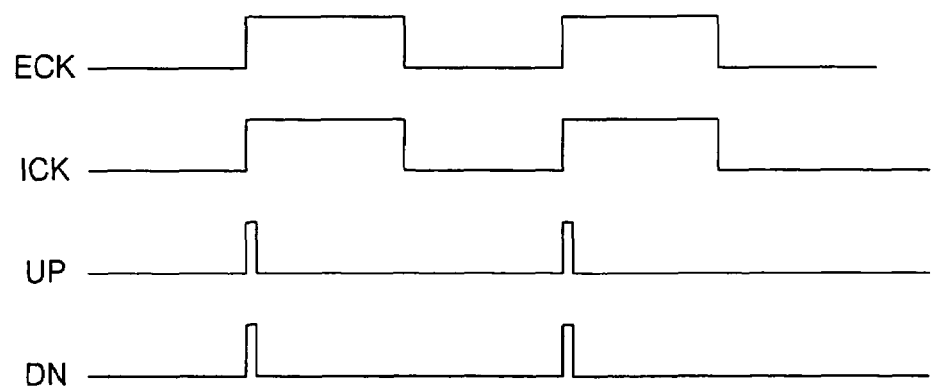

FIGS. 3a to 3c are timing diagrams illustrating operation of the phase difference detector of FIG. 2.

When the phase of the input clock signal ECK leads the phase of the output clock signal ICK, the D-flip flop DF1 outputs a high level on the up signal UP on the rising edge of the input clock signal ECK as shown in FIG. 3a. Then, the D-flip flop DF2 outputs a high level on the down signal DN in response to the rising edge of the output clock signal ICK. The NAND gate NA then generates a low level, resetting the D-flip flops DF1 and DF2, changing the up signal UP and the down signal DN to a low level. Similarly, when the phase of the input clock signal ECK lags the phase of the output clock signal ICK, the up signal UP and the down signal DN are generated as shown in FIG. 3b.

When the phase of the input clock signal ECK is identical to the phase of the output clock signal ICK, as shown in FIG. 3c, the D-flip flop DF1 outputs a high level on the up signal UP at the same time the D-flip flop DF2 outputs a high level on the down signal DN. The NAND gate NA then generates a low level, and the D-flip flops DF1 and DF2 are reset, changing the up signal UP and the down signal DN to a low level.

Figure 4:
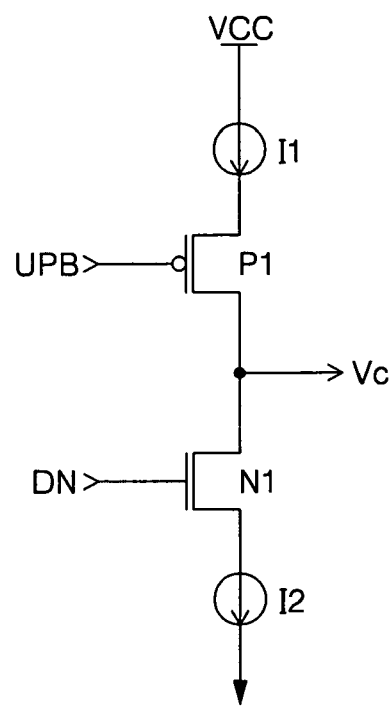
FIG. 4 is a circuit diagram illustrating a charge pump of the conventional phase locked loop of FIG. 1.

FIG. 4 is a circuit diagram illustrating the charge pump 12 of the conventional phase locked loop of FIG. 1. The charge pump 12 of FIG. 4 includes supply and discharge constant current sources I1 and I2, a PMOS transistor P1, and an NMOS transistor N1. The operation of the charge pump 12 is explained below.

When an inverted up signal UPB has a low level, the PMOS transistor P1 is turned on, so that the current of the supply constant current source I1 is supplied to an output terminal through the PMOS transistor P1, raising the voltage level of the control signal Vc.

When the down signal DN has a high level, the NMOS transistor N1 is turned on, so that the current from the output terminal is discharged through the NMOS transistor N1 by the discharge constant current source I2, decreasing the voltage level of the control signal Vc.

When the inverted up signal UPB has a low level and the down signal DN has a high level in the locked state, the PMOS transistor P1 and the NMOS transistor N1 are turned on. Current is supplied to the output terminal from the supply constant current source I1, and discharged from the output terminal through the discharge constant current source I2. If the current supplied and the current discharged are identical the voltage level of the control signal Vc does not change.

Practically, the supply constant current source I1 and the discharge constant current source I2 do not supply and discharge the same amount of current during operation. Thus, as shown in FIG. 3c, the loop which should enter the locked state only when the up signal UP and the down signal are identical in pulse width and phase, enters the locked state when the up signal UP and the down signal are not identical in pulse width and phase because of the difference between the supply and discharge currents.

Figure 5:
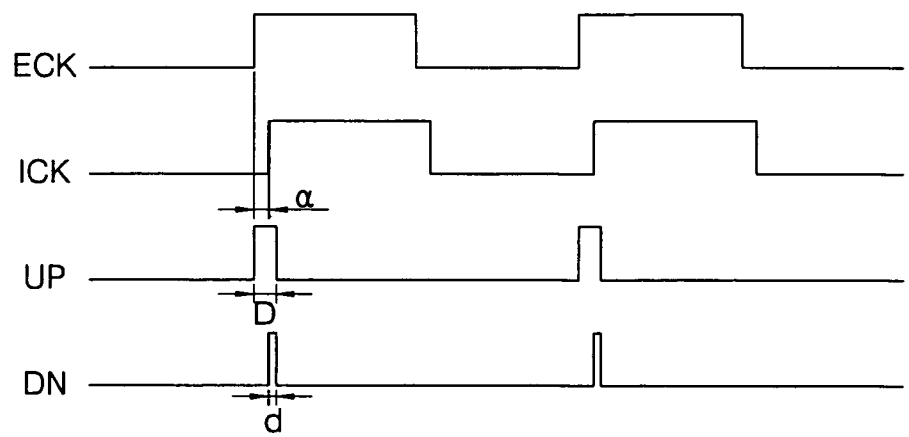
FIG. 5 is a timing diagram illustrating the operation of the phase difference detector after the loop enters a locked state with current amount difference between the supply constant current source and the discharge constant current source.

FIG. 5 is a timing diagram illustrating the operation of the phase difference detector after it enters a locked state with a current amount difference between the supply constant current source I1 and the discharge constant current source I2. In the locked state, the input clock signal ECK and the output clock signal ICK have a phase difference α between them so that the up signal UP has a pulse width D and the down signal DN has a pulse width d. Therefore, the up signal UP and the down signal DN are not identical.

Thus, due to the current amount difference between the supply constant current source I1 and the discharge constant current source I2, the conventional phase locked loop enters a locked state with a phase difference between the input clock signal ECK and the output clock signal ICK.

Figure 6:
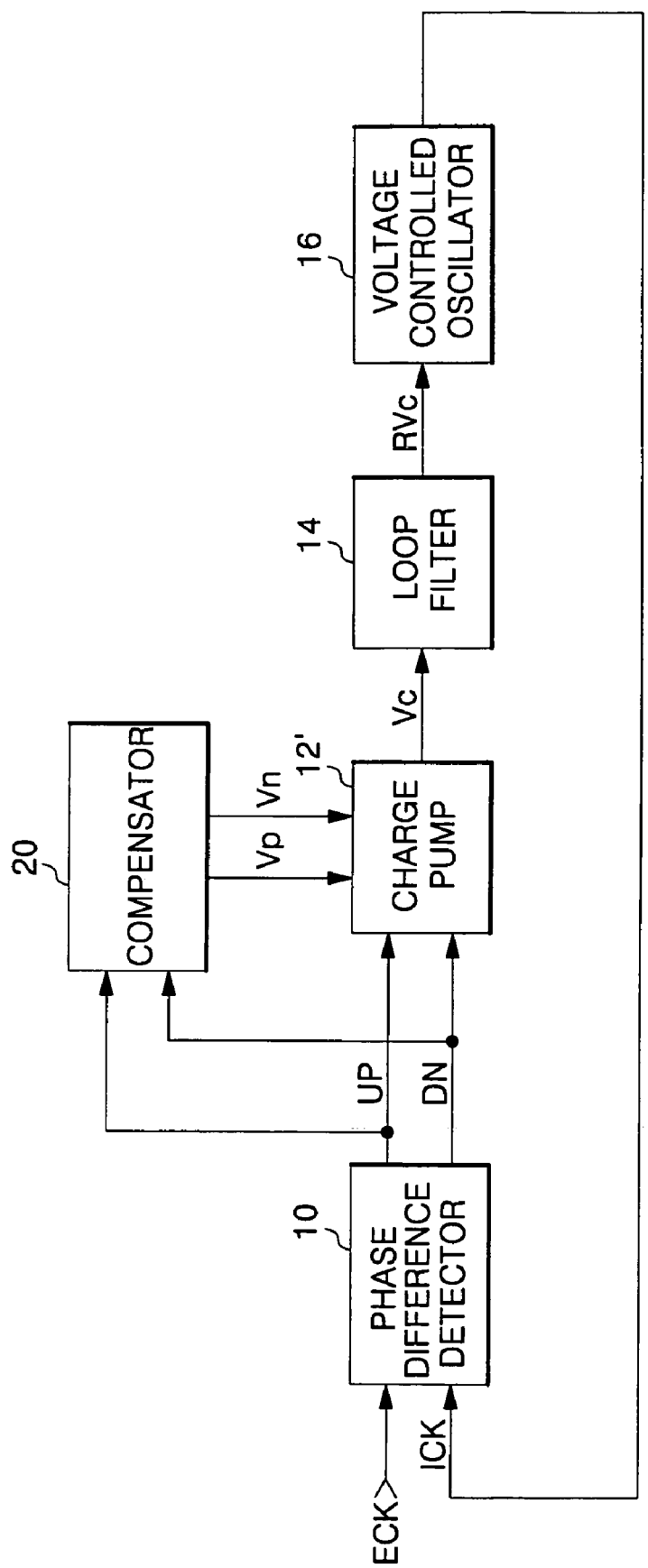
FIG. 6 is a block diagram illustrating a phase locked loop with a compensator.

FIG. 6 is a block diagram illustrating a phase locked loop with a compensator. The phase locked loop of FIG. 6 includes a phase difference detector 10, a charge pump 12', a loop filter 14, a voltage controlled oscillator 16, and a compensator 20. The functions of the components of FIG. 6 are explained below. Like reference numerals of FIGS. 1 and 6 denote like parts and like operation and functions as described above.

The compensator 20 is enabled in the locked state to vary levels of first and second control voltages Vp and Vn according to a phase difference between the up signal UP and the down signal DN. The charge pump 12' performs a pumping operation to increase the voltage level of the control signal Vc in response to the up signal UP and performs a pumping operation to decrease the voltage level of the control voltage Vc in response to the down signal DN, before the loop enters a locked state. In the locked state the charge pump 12' performs a pumping operation to maintain the voltage level of the control voltage Vc in response to the up signal UP and the first control voltage Vp, and the down signal DN and the second control voltage Vn.

In the locked state, the phase locked loop of FIG. 6 decreases the first and second control voltages Vp and Vn when the up signal UP is generated before the down signal DN, and increases the first and second control voltages Vp and Vn when the up signal UP is generated after the down signal DN. The charge pump 12' makes the supply current amount and the discharge current amount substantially the same either by increasing the supply current compared to the discharge current by decreasing the first and second control voltages Vp and Vn when the supply constant current is smaller than the discharge constant current, or by increasing the discharge current compared to the supply current by increasing the first and second control voltages Vp and Vn when the supply current is greater than the discharge current.

Figure 7:
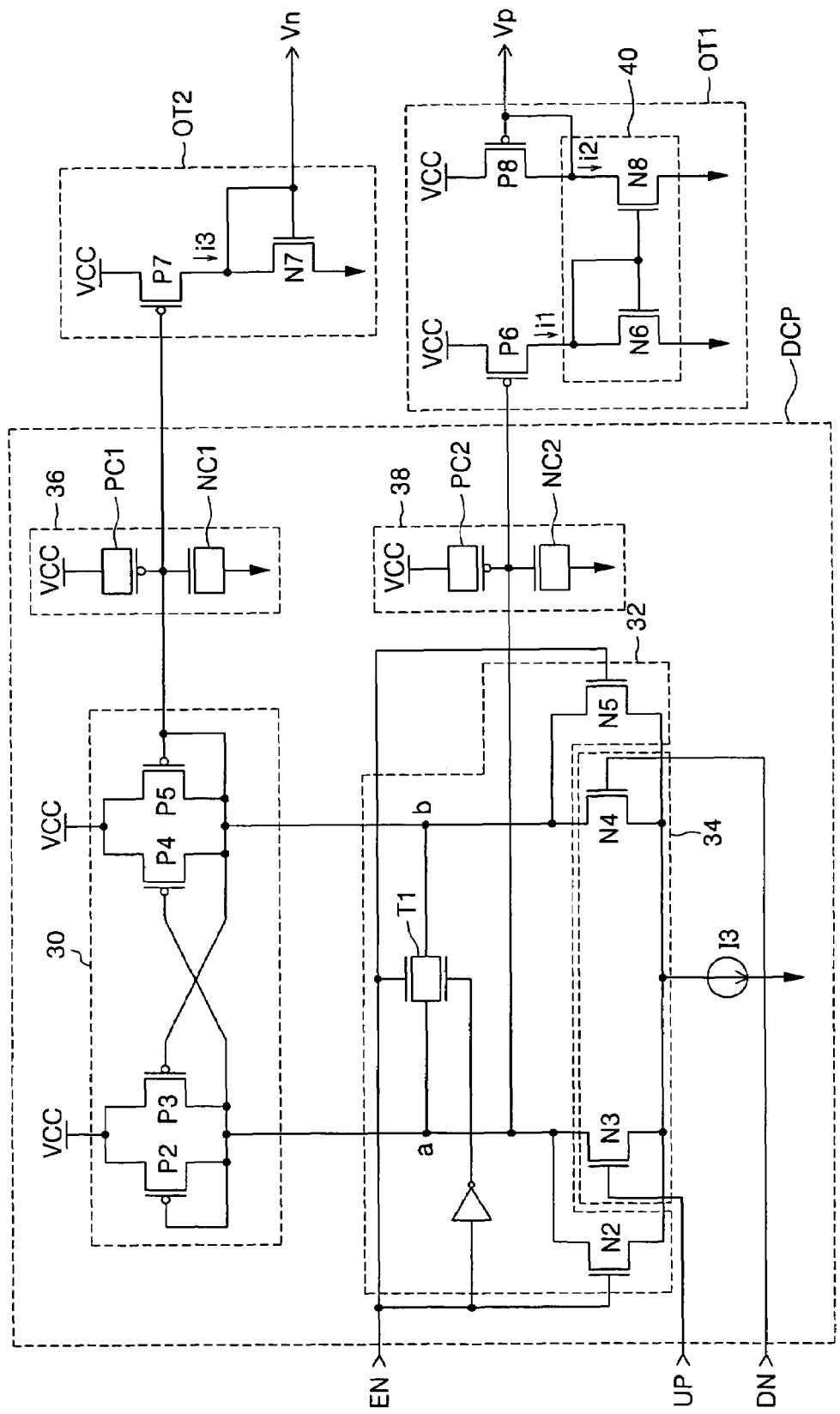
FIG. 7 is a circuit diagram illustrating an example of a compensator of the phase locked loop of FIG. 6.

FIG. 7 is a circuit diagram illustrating an example of a compensator 20 of the phase locked loop of FIG. 6. The compensator 20 of FIG. 7 includes a differential charge pump DCP which has an amplifying portion 30, a precharge portion 32, an input portion 34, first and second integrators 36 and 38, and bias current source I3, a first control voltage output portion OT1 which has PMOS transistors P6 and P8 and a current mirror 40, and a second control voltage output portion OT2 which has a PMOS transistor P7 and an NMOS transistor N7.

In FIG. 7, the amplifying portion 30 includes PMOS transistors P2 to P5, the precharge portion 32 includes a CMOS transmission gate T1 and NMOS transistors N2 and N5, and the input portion 34 includes NMOS transistors N3 and N4. The first integrator 36 includes a PMOS capacitor PC1 and an NMOS capacitor NC1, and the second integrator 38 includes a PMOS capacitor PC2 and an NMOS capacitor NC2. The current mirror 40 includes NMOS transistors N6 and N8.

An enable signal EN is set to a low level after the phase locked loop enters a locked state. The functions of the components of FIG. 7 are explained below.

The differential charge pump DCP precharges first and second nodes a and b to a precharge voltage level in response to a high level on the enable signal EN and generates a level difference between the first and second nodes a and b in response to a voltage difference between the up signal UP and the down signal DN when a low level is on the enable signal EN in the locked state.

The precharge portion 32 precharges the first and second nodes a and b to the same precharge voltage level in response to a high level on the enable signal EN. The input portion 34 generates a voltage difference between the first and second nodes a and b in response to the up signal UP and the down signal DN after the loop enters the locked state. The amplifying portion 30 amplifies a voltage difference between the first and second nodes a and b. The first integrator 36 integrates a voltage of the first node a, and the second integrator 38 integrates a voltage of the second node b.

The first control voltage output portion OT1 varies a level of the first control voltage Vp in response to a voltage of the first node a. The second control voltage output portion OT2 varies a level of the second control voltage Vn in response to a voltage of the second node b.

The operation of the compensator FIG. 7 is explained below.

When the enable signal EN is a high level, the CMOS transmission gate T1 and the NMOS transistors N2 and N5 are turned on to precharge the first and second nodes a and b to the same precharge voltage level.

After the loop enters the locked state, the enable signal EN changes to a low level and the differential charge pump DCP is enabled. The CMOS transmission gate T1 and the NMOS transistors N2 and N5 are turned off so that levels of the first and second nodes a and b may vary in response to the up signal UP and the down signal DN.

If the up signal UP is a high level and the down signal DN is a low level, the level of the first node a is lowered, and the level of the second node b is raised. When the level of the first node a is lowered, the channel width of the PMOS transistor P6 is increased, and the current i1 which flows through the NMOS transistor N6 is increased. The NMOS transistor N8 mirrors the current i1 in current i2 so that, as the current i1 increases, the current i2 increases. The PMOS transistor P8 generates the second control voltage Vp corresponding to the mirrored current i2. As the mirrored current i2 increases, the level of the second control voltage Vp decreases. As the level of the second node b increases, the channel width of the PMOS transistor P7 decreases, and thus the current i3 decreases. The channel width of the NMOS transistor N7 decreases, and the level of the first control voltage Vn decreases.

Alternatively, if the up signal UP is a low level and the down signal DN is a high level, the level of the first node a increases, and the level of the second node b decreases. When the level of the first node a increases, the channel width of the PMOS transistor P6 decreases, the current i1 which flows through the NMOS transistor N6 decreases, and the current i2 mirrored through the NMOS transistor N8, decreases. The PMOS transistor P8 generates the second control voltage Vp corresponding to the mirrored current i2. As the mirrored current i2 decreases, the second control voltage Vp increases. As the level of the second node b decreases, the channel width of the PMOS transistors P7 increases, and thus the current i3 increases. The channel width of the NMOS transistor N7 increases, and the first control voltage Vn increases.

Thus, the compensator of FIG. 7 precharges voltages of the nodes a and b to the precharge voltage level if the enable signal EN is a high level and generates a voltage corresponding to a voltage difference between the up signal UP and the down signal DN on the first and second nodes a and b if the enable signal EN is a low level. The compensator decreases the first and second control voltages Vp and Vn if the up signal UP has a level higher than the down signal DN and increases levels of the first and second control voltages Vp and Vn if the up signal UP has a level lower than the down signal DN.

Figure 8:
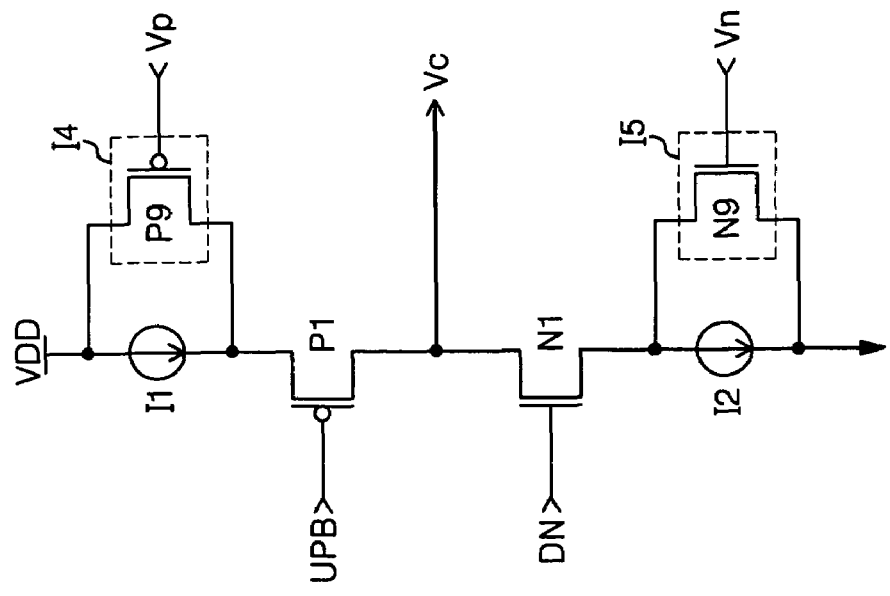
FIG. 8 is circuit diagram illustrating an example of the charge pump of the phase locked loop of FIG. 6.

FIG. 8 is a circuit diagram illustrating an example of the charge pump of the phase locked loop of FIG. 6. The charge pump of FIG. 8 includes a supply constant current source I1, a varying supply current source I4, a discharge constant current source I2, a varying discharge current source I5, a PMOS transistor P1, and an NMOS transistor N1. The charge pump of FIG. 8 has the varying supply current source I4 and the varying discharge current source I5 in addition to configuration of the charge pump of FIG. 4. The functions of the components of FIG. 8 are explained below.

Like reference numerals of FIGS. 4 and 8 denote like parts and perform like operation, and function as described above.

The varying supply current source I4 and the varying discharge current source I5 vary in response to the control voltages Vp and Vn. The varying supply current source I4 increases the supply current if the first control voltage Vp decreases, and decreases the supply current if the first control voltage Vp increases. The varying discharge current source I5 increases the discharge current if the second control voltage Vn increases and decreases the discharge current if the second control voltage Vn decreases.

Thus, the supply current supplied from the varying supply current source I4 is reduced and the discharge current discharged by the varying discharge current source I5 is increased if the first and second control voltages Vp and Vn increase. Alternatively, the supply current supplied from the varying supply current source I4 is increased and the discharge current discharged by the varying discharge current source I5 is decreased if the first and second control voltages Vp and Vn decrease.

Accordingly, the supply current supplied by the supply constant current source I1 and the varying supply current source I4, and the discharge current discharged by the discharge constant current source I2 and the varying discharge current source I5, become substantially equal because the difference between the supply constant current source I1 and the discharge constant current source I2 is compensated by the varying supply current source and the varying discharge current source.

The charge pump of FIG. 8 compensates the current amount difference between the supply constant current source I1 and the discharge constant current source I2 by making the current of the varying supply current source I4 greater than the current of the varying discharge current source I5 if the current of the supply constant current source I1 is smaller than the current of the discharge constant current source I2, and by making the current of the varying supply current source I4 smaller than the current of the varying discharge current source I5 if the current of the supply constant current source I1 is greater than the current of the discharge constant current source I2. As a result, the phase difference between the input clock signal ECK and the output clock signal ICK is reduced, and the pulse width and phase difference between the up signal UP and the down signal DN is reduced.

Figure 9:
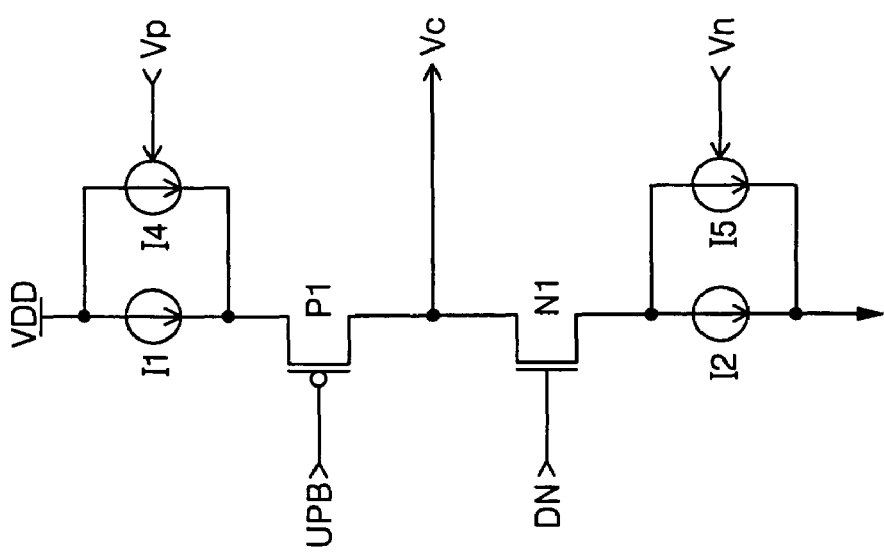
FIG. 9 is a circuit diagram illustrating an example of the charge pump of FIG. 8.

FIG. 9 is a circuit diagram illustrating an example of the charge pump of FIG. 8. The varying supply current source I4 and the varying discharge current source I5 are respectively replaced with a PMOS transistor P9 and an NMOS transistor N9.

Operation of the charge pump of FIG. 9 is explained below.

If the first and second control voltages Vp and Vn increase, the PMOS transistor decreases the varying supply current, and the NMOS transistor N9 increases the varying discharge current. Alternatively, if the first and second control voltages Vp and Vn decrease, the PMOS transistor increases the varying supply current, and the NMOS transistor N9 decreases the varying discharge current. As a result, the charge pump of FIG. 9 performs the same operation as that of FIG. 8.

Figure 10:
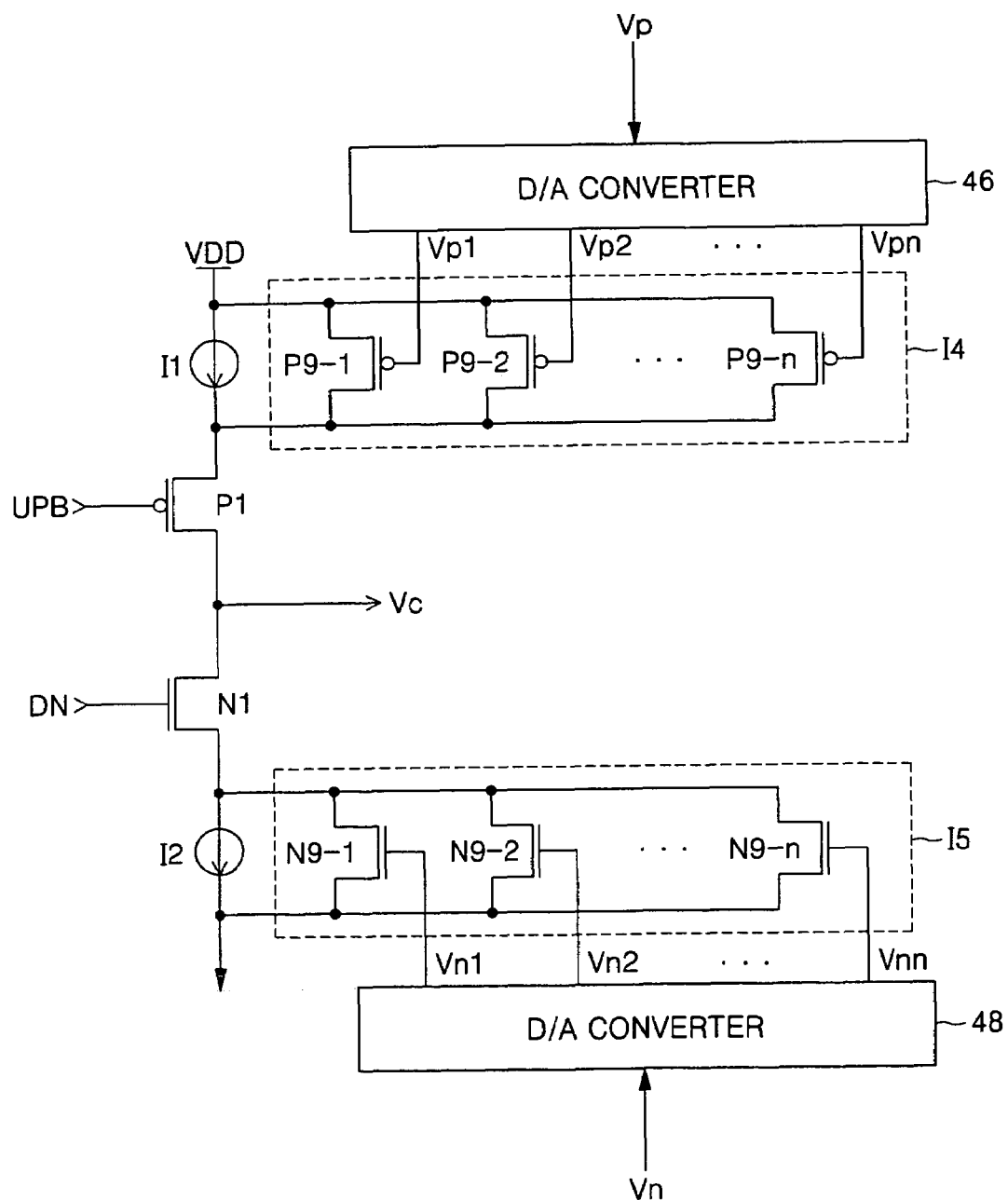
FIG. 10 is a circuit diagram illustrating another example of the charge pump of FIG. 8.

FIG. 10 is a circuit diagram illustrating another example of the charge pump of FIG. 8. The varying supply current source I4 and the varying discharge current source I5 of FIG. 8 are respectively replaced with n PMOS transistors P9-1 to P9-$n$ and n NMOS transistors N9-1 to N9-$n$, and digital to analog (D/A) converters 46 and 48.

Operation of the charge pump of FIG. 10 is explained below.

The D/A converter 46 receives the first control voltage Vp to generate n first digital signals Vp1 to Vpn, and the D/A converter 48 receives the second control voltage Vn to generate n second digital signals Vn1 to Vn.

If the number of high levels of the n first digital signals Vp1 to Vpn and the n second digital signals Vn1 to Vnn increases, the varying supply current supplied by the varying supply current source I4 including the PMOS transistors P9-1 to P9-$n$ decreases, and the varying discharge current supplied by the varying discharge current source I5 including the NMOS transistors N9-1 to N9-$n$ increases. Alternatively, if the number of the high levels of the n-bit first digital signals Vp1 to Vpn and the n second digital signals Vn1 to Vnn decreases, the varying supply current supplied by the varying supply current source I4 increases, and the varying discharge current supplied by the varying discharge current source I5 decreases. As a result, the charge pump of FIG. 10 performs a similar operation as the charge pump of FIG. 8.

An embodiment of the above phase locked loop may be implemented in a semiconductor memory device to synchronize a clock external to the phase locked loop with a clock internal to the phase locked loop.

Embodiments described above relate to a phase locked loop. Other embodiments may be implemented as a delay locked loop.

Figure 11:
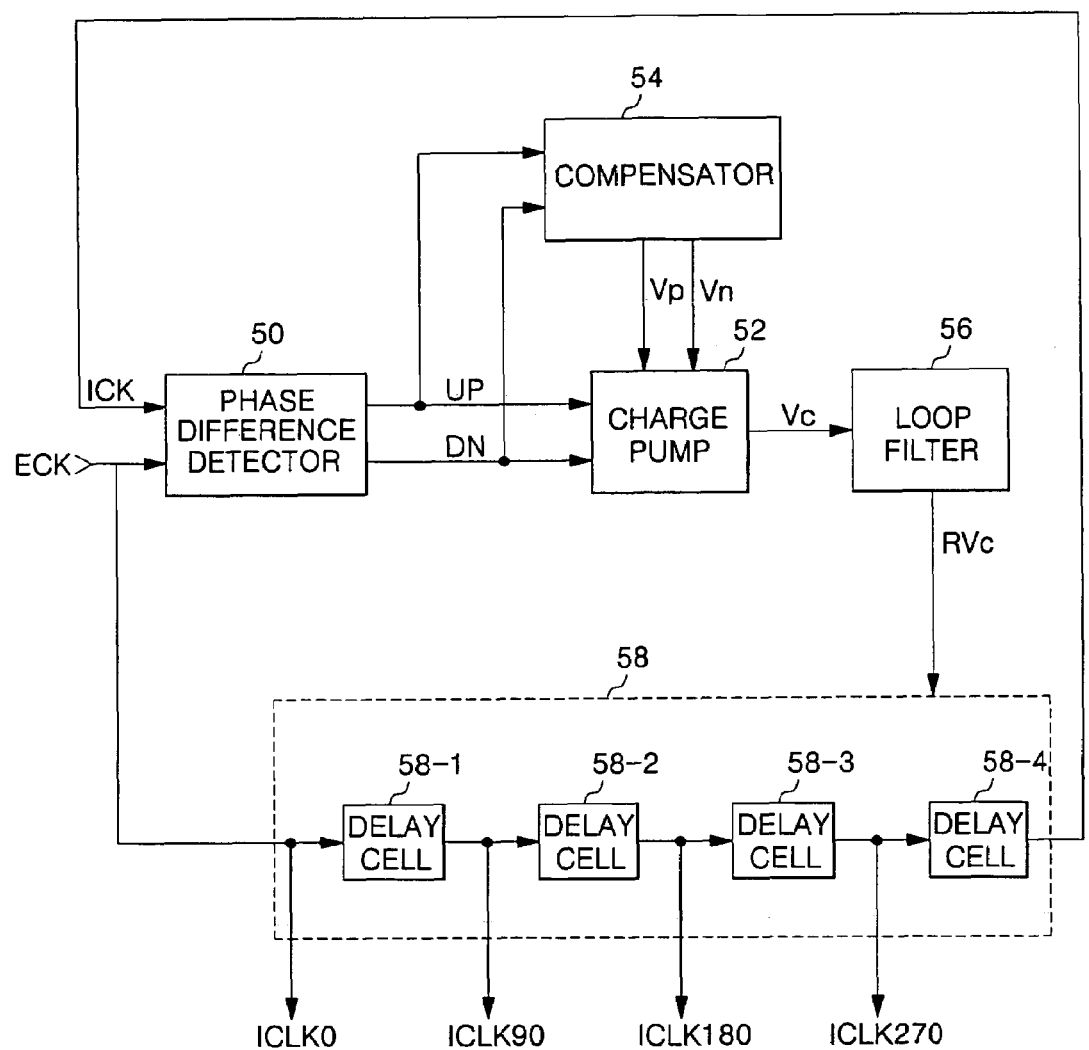
FIG. 11 is a block diagram illustrating a delay locked loop with a compensator.

FIG. 11 is a block diagram illustrating a delay locked loop according to an embodiment. The delay locked loop of FIG. 11 includes a phase difference detector 50, a charge pump 52, a compensator 54, a loop filter 56, and a delay 58. The delay 58 includes delay cells 58-1 to 58-4.

The phase difference detector 50, the charge pump 52, the compensator 54, and the loop filter 56 have the same configuration as those of FIG. 6, and thus description on those is omitted.

The delay 58 receives the input clock signal ECK and adjusts delay time of the respective delay cells 58-1 to 58-4 in response to the filtered control signal RVc to generate 4 clock signals ICLK0, ICLK90, ICLK180, and ICLK270 which respectively have a phase difference of approximately 90°.

The delay locked loop described above may be implemented in a semiconductor memory device to receive a clock signal from a portion of the device external to the delay locked loop to generate clock signals and to combine clock signals to generate output data strobe signals.

As described above, embodiments of the phase and delay locked loops compensate a phase difference between the input clock signal and the output clock signal by compensating the current amount difference between the supply current source and the discharge current source in the locked state.

Further, since the phase difference between the input clock signal and the output clock signal is compensated, a phase or pulse width difference between the up signal and the down signal can be compensated.

An embodiment of the above delay locked loop may be implemented in a semiconductor memory device to synchronize a clock external to the delay locked loop with a clock internal to the delay locked loop.

Although throughout the specification, voltages may have been described as increasing or decreasing and phases have been described as leading or lagging, one of ordinary skill in the art will appreciate that the increasing and decreasing, or the leading and lagging, may change or swap as a result of the components used during implementation.

It will be appreciated that various of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A phase locked loop, comprising:
   a phase difference detector for detecting a phase difference between an input clock signal and an output clock signal to generate an up signal and a down signal;
   a charge pump for raising a level of a control signal by supplying a supply current in response to the up signal, for lowering a level of the control signal by discharging a discharge current in response to the down signal, and for adjusting the supply current in response to a first control voltage and the discharge current in response to a second control voltage, such adjusting occurring in a locked state;
   a compensator enabled only in the locked state to generate the first and second control voltages corresponding to a difference between the up signal and the down signal; and
   a voltage controlled oscillator for varying a frequency of the output clock signal in response to the control signal.

2. The phase locked loop of claim 1 wherein the phase locked loop comprises part of a semiconductor device.

3. The phase locked loop of claim 2 wherein the semiconductor device comprises a semiconductor memory device.

4. The phase locked loop of claim 1, further comprising a loop filter for filtering the control signal to generate a filtered control signal, wherein the voltage controlled oscillator varies the frequency of the output clock signal in response to the filtered control signal.

5. The phase locked loop of claim 1, wherein the charge pump includes:
   a supply constant current source for supplying the supply current;
   a discharge constant current source for discharging the discharge current;
   a varying supply current source coupled to the supply constant current source to change the supply current in response to the first control voltage;
   a varying discharge current source coupled to the discharge constant current source to change the discharge current in response to the second control voltage;

a first switch to supply the supply current to an output terminal in response to the up signal; and a second switch to discharge the discharge current from the output terminal in response to the down signal.

6. The phase locked loop of claim 5, wherein the first switch comprises a PMOS transistor.

7. The phase locked loop of claim 5, wherein the second switch comprises an NMOS transistor.

8. The phase locked loop of claim 1, wherein in the locked state, the compensator increases the first and second control voltages if the up signal is generated before the down signal and decreases the first and second control voltages if the up signal is generated after the down signal.

9. The phase locked loop of claim 8, wherein the compensator further comprises:

a differential charge pump for precharging a first and a second output signal to a precharge level in response to an enable signal, and for generating a voltage difference between the first and second output signals corresponding to the difference between the up signal and the down signal in the locked state;

a first output portion for varying the first control voltage in response to the first output signal; and a second output portion for varying the second control voltage in response to the second output signal.

10. The phase locked loop of claim 9, wherein the compensator further comprises first and second integrators for integrating the first and second output signals to generate integrated first and second output signals, respectively, wherein the first output portion varies the first control voltage in response to the integrated first output signal, and the second output portion varies the second control voltage in response to the integrated second output signal.

11. The phase locked loop of claim 9, wherein the differential charge pump further comprises:

a precharge portion for precharging the first and second output signals to the precharge level in response to the enable signal;

an input portion for receiving the up and down signals to generate the voltage difference between the first and second output signals; and an amplifying portion for amplifying the voltage difference between the first and second output signals.

12. The phase locked loop of claim 9, wherein the first output portion includes:

a first load transistor coupled to a power voltage and to receive the first output signal;

a current mirror for mirroring a first current of the first load transistor to generate a mirrored first current; and a first transistor coupled between the power voltage and the first control voltage to generate the first control voltage in response to the mirrored first current.

13. The phase locked loop of claim 9, wherein the second output portion includes:

a second load transistor coupled to a power voltage and to receive the second output signal; and a second transistor coupled between the second load transistor and a ground voltage to generate the second control voltage in response to the second current.

14. A delay locked loop, comprising:

a phase difference detector for detecting a phase difference between an input clock signal and an output clock signal to generate an up signal and a down signal;

a charge pump for raising a level of a control signal by supplying a supply current in response to the up signal, for lowering a level of the control signal by discharging a discharge current in response to the down signal, and for adjusting the supply current in response to a first control voltage and the discharge current in response to a second control voltage, such adjusting occurring in a locked state;

a compensator for generating the first and second control voltages corresponding to a difference between the up signal and the down signal in the locked state, the compensator including an amplifier configured to amplify a voltage difference between the up signal and the down signal; and a delay element to delay the input clock signal in response to the control signal, and to generate a plurality of clock signals and the output clock signal.

15. The phase locked loop of claim 14 wherein the delay locked loop comprises part of a semiconductor device.

16. The phase locked loop of claim 15 wherein the semiconductor device comprises a semiconductor memory device.

17. The delay locked loop of claim 14, further comprising a loop filter for filtering the control signal to generate a filtered control signal, wherein the delay element varies the delay of the input clock signal in response to the filtered control signal.

18. The delay locked loop of claim 14, wherein the charge pump includes:

a supply constant current source for supplying the supply current;

a discharge constant current source for discharging the discharge current;

a varying supply current source coupled to the supply constant current source to change the supply current in response to the first control voltage;

a varying discharge current source coupled to the discharge constant current source to change the discharge current in response to the second control voltage;

a first switch to supply the supply current to an output terminal in response to the up signal; and a second switch to discharge the discharge current from the output terminal in response to the down signal.

19. The delay locked loop of claim 18, wherein the first switch comprises a PMOS transistor.

20. The delay locked loop of claim 18, wherein the second comprises an NMOS transistor.

21. The delay locked loop of claim 14, wherein, in the locked state, the compensator increases the first and second control voltages if the up signal is generated before the down signal and decreases the first and second control voltages if the up signal is generated after the down signal.

22. The delay locked loop of claim 21, wherein the compensator includes:

a differential charge pump for precharging a first and a second output signal to a precharge level in response to an enable signal, and for generating a voltage difference between first and second output signals corresponding to the difference between the up signal and the down signal in the locked state;

a first output portion for varying the first control voltage in response to the first output signal; and a second output portion for varying the second control voltage in response to the second output signal.

23. The delay locked loop of claim 22, wherein the compensator further comprises first and second integrators for integrating the first and second output signals to generate integrated first and second output signals, respectively, wherein the first output portion varies the first control voltage in response to the integrated first output signal, and the second output portion varies the second control voltage in response to the integrated second output signal.

24. The delay locked loop of claim 22, wherein the differential charge pump includes:
   a precharge portion for precharging the first and second output signals to the precharge level in response to the enable signal;
   an input portion for receiving the up and down signals to generate the voltage difference between the first and second output signals; and
   an amplifying portion for amplifying the voltage difference between the first and second output signals.

25. The delay locked loop of claim 22, wherein the first output portion includes:
   a first load transistor coupled to a power voltage and to receive the first output signal;
   a current mirror for mirroring a first current of the first load transistor to generate a mirrored first current; and
   a first transistor coupled to the power voltage and the first control voltage to generate the first control voltage in response to the mirrored current.

26. The delay locked loop of claim 22, wherein the second output portion includes:
   a second load transistor coupled to a power voltage and to receive the second output signal; and
   a second transistor coupled between the second load transistor and a ground voltage and to generate the second control voltage in response to the second current.

27. A charge pump comprising:
   a supply current source to supply current to a node in response to an up signal;
   a discharge current source to discharge current from a node in response to a down signal; and
   a compensator to adjust at least one of the supply current source and the discharge current source in response to at least one of the up signal and the down signal; wherein:
   the supply current source further comprises a supply constant current source and a variable supply current source; and
   the discharge current source further comprises a discharge constant current source and a variable discharge current source.

28. The charge pump of claim 27 wherein the compensator is further constructed and arranged to adjust the supply current source and the discharge current source so that the up signal and the down signal become substantially equivalent.

29. The charge pump of claim 27 wherein the charge pump further comprises part of a phase locked loop.

30. The charge pump of claim 27 wherein the charge pump further comprises part of a delay locked loop.

31. A control loop comprising:
   a phase difference detector for detecting a phase difference between an input clock signal and an output clock signal to generate an up signal and a down signal;
   a charge pump for raising a level of a control signal by supplying a supply current in response to the up signal, for lowering a level of the control signal by discharging a discharge current in response to the down signal, and for adjusting the supply current in response to a first control voltage and the discharge current in response to a second control voltage, such adjusting occurring in a locked state;
   a compensator for generating the first and second control voltages corresponding to a difference between the up signal and the down signal in the locked state, the compensator configured to be enabled in the locked state in response to an enable signal; and
   a controlled element to generate the output clock signal in response to the control signal.

32. The control loop of claim 31, wherein the controlled element further comprises a delay element to delay the input clock signal in response to the control signal, and to generate a plurality of clock signals and the output clock signal.

33. The control loop of claim 31, wherein the controlled element further comprises a voltage controlled oscillator for varying a frequency of the output clock signal in response to the control signal.

34. The control loop of claim 31, wherein the supply current changes in a first direction in response to the first control voltage while the discharge current changes in a second direction in response to the second control voltage, the first direction and the second direction being different.

* * * * *